(12) United States Patent
Yamamoto et al.

(10) Patent No.: US 10,106,700 B2
(45) Date of Patent: Oct. 23, 2018

(54) PROTECTION MEMBRANE FORMING FILM, PROTECTION MEMBRANE FORMING UTILIZATION SHEET, PRODUCTION METHOD AND INSPECTION METHOD FOR WORKPIECE OR PROCESSED PRODUCT, WORKPIECE DETERMINED AS ADEQUATE PRODUCT, AND PROCESSED PRODUCT DETERMINED AS ADEQUATE PRODUCT

(71) Applicant: Lintec Corporation, Tokyo (JP)

(72) Inventors: Daisuke Yamamoto, Warabi (JP);
Hiroyuki Yoneyama, Nagareyama (JP);
Youichi Inao, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 15/127,378

(22) PCT Filed: Mar. 23, 2015

(86) PCT No.: PCT/JP2015/058797
§ 371 (c)(1),
(2) Date: Sep. 19, 2016

(87) PCT Pub. No.: WO2015/146936
PCT Pub. Date: Oct. 1, 2015

(65) Prior Publication Data
US 2017/0130090 A1    May 11, 2017

(30) Foreign Application Priority Data
Mar. 24, 2014 (JP) ................................. 2014-060968

(51) Int. Cl.
*C09D 163/00* (2006.01)
*H01L 23/544* (2006.01)
(Continued)

(52) U.S. Cl.
CPC .......... *C09D 163/00* (2013.01); *C09J 7/0207* (2013.01); *H01L 21/6836* (2013.01);
(Continued)

(58) Field of Classification Search
None
See application file for complete search history.

(56) References Cited

U.S. PATENT DOCUMENTS

2001/0011575 A1    8/2001  Nakata et al.
2003/0165753 A1    9/2003  Suzuki et al.
(Continued)

FOREIGN PATENT DOCUMENTS

CN    1545729 A    11/2004
CN    1655327 A    8/2005
(Continued)

OTHER PUBLICATIONS

International Search Report for international application No. PCT/JP2015/058797.
(Continued)

*Primary Examiner* — Angel Roman
(74) *Attorney, Agent, or Firm* — Christopher Casieri

(57) ABSTRACT

A protection membrane-forming film (1) containing a filler, wherein the average particle size of the filler is not more than 0.4 μm, a protection membrane-forming sheet (2), a production method and an inspection method for a workpiece or a processed product which use the film and the sheet, and a workpiece and a processed product determined as adequate products by the inspection method. The protection membrane-forming film and the protection membrane-forming sheet of the invention enable the formation of a protection membrane having excellent print legibility when subjected to print processing by laser irradiation.

16 Claims, 3 Drawing Sheets

(51) Int. Cl.
*H01L 21/66* (2006.01)
*H01L 23/31* (2006.01)
*H01L 21/683* (2006.01)
*H01L 21/78* (2006.01)
*C09J 7/02* (2006.01)
*H01L 23/29* (2006.01)
*C08K 5/00* (2006.01)
*C08K 3/00* (2018.01)
*C08K 3/013* (2018.01)

(52) U.S. Cl.
CPC .............. *H01L 21/78* (2013.01); *H01L 22/12* (2013.01); *H01L 23/295* (2013.01); *H01L 23/3171* (2013.01); *H01L 23/544* (2013.01); *C08K 3/0033* (2013.01); *C08K 3/013* (2018.01); *C08K 5/0041* (2013.01); *C08K 2201/003* (2013.01); *C09J 2463/003* (2013.01); *H01L 2221/6834* (2013.01); *H01L 2221/68327* (2013.01); *H01L 2223/54406* (2013.01); *H01L 2223/54433* (2013.01)

(56) References Cited

U.S. PATENT DOCUMENTS

| | | |
|---|---|---|
| 2004/0241962 A1 | 12/2004 | Nagai |
| 2006/0025305 A1 | 2/2006 | Suzuki et al. |
| 2006/0102987 A1 | 5/2006 | Saiki et al. |
| 2011/0156279 A1 | 6/2011 | Takamoto et al. |
| 2012/0028380 A1 | 2/2012 | Takamoto et al. |
| 2012/0205357 A1 | 8/2012 | Fukuyo et al. |
| 2014/0159254 A1* | 6/2014 | Takamoto ........... H01L 21/6836 257/778 |
| 2015/0093499 A1* | 4/2015 | Groppel ................. B82Y 30/00 427/116 |

FOREIGN PATENT DOCUMENTS

| | | |
|---|---|---|
| CN | 1684225 A | 10/2005 |
| CN | 1828863 A | 9/2006 |
| CN | 102153960 A | 8/2011 |
| CN | 102318059 A | 1/2012 |
| CN | 102373020 A | 3/2012 |
| CN | 102947929 A | 2/2013 |
| CN | 104838490 A | 8/2015 |
| CN | 105934811 A | 9/2016 |
| JP | 2003-320622 A | 11/2003 |
| JP | 2006-140348 A | 6/2006 |
| JP | 2011-151360 A | 8/2011 |
| JP | 2012-028396 A | 2/2012 |
| JP | 2012-033741 A | 2/2012 |
| JP | 2013-165245 A | 8/2013 |

OTHER PUBLICATIONS

Office Action for Chinese application No. 201580015032.1 dated Apr. 4, 2018.

* cited by examiner

PROTECTION MEMBRANE FORMING FILM, PROTECTION MEMBRANE FORMING UTILIZATION SHEET, PRODUCTION METHOD AND INSPECTION METHOD FOR WORKPIECE OR PROCESSED PRODUCT, WORKPIECE DETERMINED AS ADEQUATE PRODUCT, AND PROCESSED PRODUCT DETERMINED AS ADEQUATE PRODUCT

This application is a 371 of international application No. PCT/JP2015/058797, filed Mar. 23, 2015, which, in turn, claims priority of Japanese Patent Application No.: 2014-060968, filed on Mar. 24, 2014.

TECHNICAL FIELD

The present invention relates to a protection membrane-forming film and a protection membrane-forming sheet capable of forming a protection membrane on a workpiece such as a semiconductor wafer or a processed product obtained by processing the workpiece (for example, a semiconductor chip), and also relates to a production method and an inspection method for a workpiece or processed product using the protection membrane-forming film or protection membrane-forming sheet, and a workpiece and a processed product determined as adequate products by the inspection method.

BACKGROUND ART

In recent years, many semiconductor devices have been produced by the mounting method known as the face-down method. In this method, during mounting of a semiconductor chip having a circuit surface on which electrodes such as bumps or the like have been formed, the circuit surface side of the semiconductor chip is affixed to a chip-mounting unit such as a lead frame. Accordingly, a structure is formed in which the back surface of the semiconductor ship on which no circuit is formed is exposed.

As a result, in order to protect the semiconductor chip, a protection membrane formed from a hard organic material is often formed on the back surface of the semiconductor chip. This protection membrane is formed, for example, using the type of semiconductor back surface film or dicing tape-integrated wafer back surface protection membrane described in Patent Document 1.

In some cases, the protection membrane may also be used as a member for displaying information relating to the workpiece (for example, a semiconductor wafer) or processed product (for example, a semiconductor chip) on which the protection membrane is provided. In other words, in some cases a printing process is performed in which information relating to the workpiece or the processed product is displayed in a visible manner by forming unevenness on the surface of the protection membrane. This printing process is typically performed by irradiating a laser onto the surface of the protection membrane.

In this regard, the semiconductor back surface film disclosed in Patent Document 1 exhibits a light transmittance of 20% or less at a wavelength of 532 nm or 1,064 nm. This enables a printing process to be performed by laser beam irradiation, while preventing any adverse effects on the semiconductor element caused by the laser beam.

PRIOR ART LITERATURE

Patent Documents

Patent Document 1: Japanese Unexamined Patent Application, First Publication No. 2012-28396

DISCLOSURE OF INVENTION

Problems to be Solved by the Invention

From the viewpoint of enhancing the ease of recognition of the information that is based on the unevenness formed on the surface of the protection membrane by a printing process (also referred to as "print legibility" in the present description), it is preferable to increase the amount of process energy supplied from the processing tool such as a laser used in the printing process. A larger amount of process energy yields a greater height difference in the unevenness, thus enhancing the legibility of the information. Using a pulsed laser as a specific example, the amount of process energy from the laser can be increased by increasing the number of irradiation pulses and/or increasing the irradiation energy per pulse.

However, if the amount of process energy supplied to the protection membrane is increased in this manner, then the possibility of damaging the workpiece or processed product on which the protection membrane is formed also increases. Accordingly, a technique that enables the print legibility of the protection membrane to be increased without increasing the amount of energy supplied to the protection membrane for the purpose of print processing would be very desirable.

The present invention has been developed in light of the above circumstances, and has an object of providing a protection membrane-forming film and a protection membrane-forming sheet that enable the formation of a protection membrane having excellent print legibility, as well as a production method and an inspection method for a workpiece or a processed product which use the protection membrane-forming film or protection membrane-forming sheet. The present invention also has an object of providing a workpiece and a processed product that are determined as adequate products by the above inspection method.

Means for Solving the Problems

As a result of investigations aimed at achieving the above objects, the inventors of the present invention made the novel finding that by ensuring that the average particle size of the filler contained in the protection membrane-forming film is not more than 0.4 µm, print processing of the protection membrane-forming film, or the protection membrane obtained therefrom, by laser irradiation was able to easily form a protection membrane having excellent print legibility. In the present description, an average particle size of less than 1 µm for a filler refers to a value measured by a dynamic light-scattering method using a particle size distribution analyzer (Nanotrac Wave UT151, manufactured by Nikkiso Co., Ltd.). Further, an average particle size of 1 µm or larger for a filler refers to a value measured by a laser diffraction and scattering method using a particle size distribution analyzer (Microtrac MT3000II, manufactured by Nikkiso Co., Ltd.).

The present invention, which was completed as a result of the above finding, is as follows.

(1) A protection membrane-forming film containing a filler, wherein the average particle size of the filler is not more than 0.4 μm.

(2) The protection membrane-forming film according to (1) above, wherein the 60-degree specular glossiness Gs (60°) prescribed in JIS Z 8741:1997 (ISO 2813:1994) of the protection membrane formed from the protection membrane-forming film is 40% or higher.

(3) The protection membrane-forming film according to (1) or (2) above, having a light transmittance at a wavelength of 550 nm of not more than 20%.

(4) The protection membrane-forming film according to any one of (1) to (3) above, having a light transmittance at a wavelength of 1,064 nm of at least 50%.

(5) The protection membrane-forming film according to any one of (1) to (4) above, having a light transmittance at a wavelength of 1,250 nm of at least 40%.

(6) The protection membrane-forming film according to any one of (1) to (5) above, wherein the protection membrane-forming film contains an organic-based colorant.

(7) The protection membrane-forming film according to (6) above, wherein the organic-based colorant includes a pigment.

(8) The protection membrane-forming film according to any one of (1) to (7) above, wherein the protection membrane-forming film contains an epoxy resin.

(9) The protection membrane-forming film according to (8) above, wherein the epoxy resin includes at least a liquid epoxy resin that is liquid at 23° C. and 1 atm.

(10) The protection membrane-forming film according to (9) above, wherein the epoxy resin is either composed solely of the liquid epoxy resin, or the epoxy resin contains the liquid epoxy resin and a solid epoxy resin that is solid at 23° C. and 1 atm, and the amount of the liquid epoxy resin relative to the total amount of the liquid epoxy resin and the solid epoxy resin is at least 25% by mass but less than 100% by mass.

(11) A protection membrane-forming sheet including a pressure-sensitive adhesive sheet formed by laminating a pressure-sensitive adhesive layer to one surface of a substrate, and the protection membrane-forming film according to any one of (1) to (10) above laminated to the pressure-sensitive adhesive layer side of the pressure-sensitive adhesive sheet.

(12) A production method for a workpiece or a processed product, the production method including using the protection membrane-forming film according to any one of (1) to (10) above, or the protection membrane-forming sheet according to (11) above, to form a printed protection membrane on a workpiece or a processed product formed by division processing of the workpiece.

(13) The production method for a workpiece or a processed product according to (12) above, wherein formation of the printed protection membrane includes a printing step of irradiating a laser beam onto a surface of the protection membrane-forming film, or onto a surface of a protection membrane formed from the protection membrane-forming film.

(14) The production method for a workpiece or a processed product according to (12) or (13) above, wherein the division processing is processing in which an infrared laser beam is irradiated onto focus points set within the workpiece, thereby forming a modified layer inside the workpiece, and a force is then applied to the workpiece in which the modified layer has been formed, thereby dividing the workpiece in which the modified layer has been formed and obtaining a plurality of pieces as processed products.

(15) The production method for a workpiece or a processed product according to any one of (12) to (14) above, wherein the workpiece is a semiconductor wafer, and the processed product is a semiconductor chip.

(16) An inspection method, wherein a workpiece or processed product produced by the production method according to any one of (12) to (15) above is inspected through the protection membrane using infrared radiation.

(17) A workpiece determined as an adequate product based on the inspection method according to (16) above.

(18) A processed product determined as an adequate product based on the inspection method according to (16) above.

Effects of the Invention

The protection membrane-forming film and the protection membrane-forming sheet according to the present invention enable the formation of a protection membrane having excellent print legibility. Further, by using the production method according to the present invention, a workpiece or processed product can be obtained which has a protection membrane having excellent print legibility formed thereon. Moreover, the inspection method according to the present invention enables an inspection of cracks or the like that exist in a workpiece or processed product to be performed using infrared radiation.

BEST MODE FOR CARRYING OUT THE INVENTION

Figure 1:
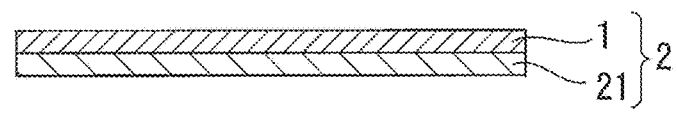
FIG. 1 is a cross-sectional view of a protection membrane-forming sheet according to an embodiment of the present invention.

Embodiments of the present invention are described below.

(Protection Membrane-Forming Film)

A protection membrane-forming film according to the present embodiment is used for forming a protection membrane on a workpiece or a processed product obtained by processing the workpiece. This protection membrane is composed of a protection membrane-forming film, and preferably a cured protection membrane-forming film.

Examples of the workpiece include semiconductor wafers and the like, and examples of the processed products obtained by processing the workpiece include semiconductor chips and the like, although the present invention is not limited to these examples. When the workpiece is a semiconductor wafer, the protection membrane is formed on the back surface of the wafer (the surface on which the electrodes such as bumps are not formed).

1. Materials

The protection membrane-forming film preferably contains an uncured curable adhesive. In this case, by curing the protection membrane-forming film once the workpiece such as a semiconductor wafer has been overlaid on the protection membrane-forming film, the protection membrane can be bonded strongly to the workpiece, and a protection membrane having good durability can be formed on the chip or the like.

The protection membrane-forming film preferably either has pressure-sensitive adhesiveness at normal temperatures, or develops pressure-sensitive adhesiveness upon heating. As a result, when the workpiece such as a semiconductor wafer is overlaid on the protection membrane-forming film, the two can be stuck together. Accordingly, positioning can be performed reliably prior to curing of the protection membrane-forming film.

The curable adhesive that constitutes the protection membrane-forming film having the types of properties described above preferably contains a curable component and a binder polymer component. A thermosetting component, an energy ray-curable component, or a mixture of the two can be used as the curable component, but the use of a thermosetting component is particularly preferred. Because the protection membrane-forming film has the type of light transmittance described above, ultraviolet curing is inappropriate, and therefore use of a thermosetting component is desirable.

Examples of the thermosetting component include epoxy resins, phenol resins, melamine resins, urea resins, polyester resins, urethane resins, acrylic resins, polyimide resins, benzoxazine resins, and mixtures thereof. Among these, an epoxy resin, a phenol resin, or a mixture thereof can be used particularly favorably.

Upon exposure to heat, epoxy resins develop a three dimensional network structure, forming a strong coating film. All manner of conventional epoxy resins can be used as the epoxy resin, and these resins can be broadly classified into those epoxy resins that are liquid (including highly viscous liquids) at 23° C. and 1 atm (hereafter sometimes referred to as "liquid epoxy resins"), and those epoxy resin that are solid (including semisolids) at 23° C. and 1 atm (hereafter sometimes referred to as "solid epoxy resins"). Specifically, liquid epoxy resins refer to epoxy resins having a viscosity of 40 Pa·s or less at 25° C. and 1 atm. In the present embodiment, any one of the above epoxy resins may be used, but the use of at least a liquid epoxy resin is preferred. In this case, the epoxy resin may be composed solely of the liquid epoxy resin, or a blend of the liquid epoxy resin and a solid epoxy resin may be used.

An epoxy resin that is liquid at 23° C. and 1 atm preferably has a molecular weight of 300 to 500, and resins having a molecular weight of 330 to 400 are particularly desirable. Further, the epoxy equivalent weight of the liquid epoxy resin is preferably within a range from 50 to 5,000 g/eq, and more preferably from 100 to 2,000 g/eq.

On the other hand, an epoxy resin that is solid at 23° C. and 1 atm preferably has a molecular weight of 1,000 to 6,000, and resins having a molecular weight of 1,400 to 4,000 are particularly desirable. The softening point of the solid epoxy resin, measured by the ring and ball method, is preferably from 50 to 150° C., and more preferably from 65 to 130° C. Moreover, the epoxy equivalent weight of the solid epoxy resin is preferably within a range from 50 to 5,000 g/eq, and more preferably from 100 to 2,000 g/eq.

Specific examples of the above epoxy resins include glycidyl ethers of phenols such as bisphenol A, bisphenol F, resorcinol, phenyl novolac and cresol novolac; glycidyl ethers of alcohols such as butanediol, polyethylene glycol and polypropylene glycol; glycidyl ethers of carboxylic acids such as phthalic acid, isophthalic acid and tetrahydrophthalic acid; glycidyl or alkylglycidyl epoxy resins obtained by substituting an active hydrogen bonded to a nitrogen atom of aniline isocyanurate or the like with a glycidyl group; and so-called alicyclic epoxides in which an epoxy group has been introduced, for example, by oxidizing an intramolecular carbon-carbon double bond, such as vinylcyclohexane diepoxide, 3,4-epoxycyclohexylmethyl-3,4-dicyclohexanecarboxylate and 2-(3,4-epoxy)cyclohexyl-5,5-spiro(3,4-epoxy)cyclohexane-m-dioxane. In addition, epoxy resins having a biphenyl backbone, a dicyclohexadiene backbone, a dicyclopentadiene backbone, or a naphthalene backbone or the like may also be used.

Among these, bisphenol-based glycidyl epoxy resins, o-cresol novolac epoxy resins, phenol novolac epoxy resins, and dicylocpentadiene epoxy resins can be used particularly favorably. These epoxy resins may be used individually, or a combination of two or more resins may be used.

When a blend of a liquid epoxy resin and a solid epoxy resin is used, the amount of the liquid epoxy resin relative to the total amount of the liquid epoxy resin and the solid epoxy resin is preferably at least 25% by mass but less than 100% by mass, more preferably from 30 to 90% by mass, and still more preferably from 35 to 80% by mass. Provided the amount of the liquid epoxy resin is at least 25% by mass, the specular glossiness of the protection membrane formed from the protection membrane-forming film can be easily adjusted to a high level, and the print legibility of the protection membrane can be further enhanced. Further, the light transmittance for prescribed wavelengths and the like can sometimes be more easily controlled so as to satisfy the preferred ranges described below. In such cases, other effects such as facilitating the division processing of the workpiece and facilitating infrared transmission inspection of the processed product can also be achieved. Using a blend of a liquid epoxy resin and a solid epoxy resin facilitates separation of the processed product and the protection membrane-forming film from the release sheet in the protection membrane-forming sheet described below.

In those cases where an epoxy resin is used, a heat-activated latent epoxy resin curing agent is preferably also used as an auxiliary. A heat-activated latent epoxy resin curing agent is a curing agent which does not react with the epoxy resin at room temperature, but is activated by heating to a certain temperature, wherein reaction with the epoxy resin proceeds. Examples of the method used for activating the heat-activated latent epoxy resin curing agent include methods in which heating causes a chemical reaction that produces an active moiety (anion or cation); methods in which the curing agent remains stably dispersed within the epoxy resin at temperatures close to room temperature, but then becomes compatible with or dissolves in the epoxy resin at higher temperature, thereby initiating the curing reaction; methods which use a molecular sieve-encapsulated curing agent, which is eluted at high temperatures and initiates the curing reaction; and methods which use microcapsules.

Specific examples of the heat-activated latent epoxy resin curing agent include high-melting point active hydrogen compounds such as various onium salts, dibasic acid dihydrazide compounds, dicyandiamide, amine adduct curing agents, and imidazole compounds. These heat-activated latent epoxy resin curing agents may be used individually, or combinations of two or more compounds may be used. The amount used of the heat-activated latent epoxy resin curing agent is preferably from 0.1 to 20 parts by mass, more preferably from 0.2 to 10 parts by mass, and still more preferably from 0.3 to 5 parts by mass, per 100 parts by mass of the epoxy resin.

For the phenol-based resin, condensation products of a phenol such as an alkylphenol, polyhydric phenol or naphthol with an aldehyde can be used without any particular limitations. Specific examples of resins that may be used include phenol novolac resins, o-cresol novolac resins, p-cresol novolac resins, t-butylphenol novolac resins, dicyclopentadiene cresol resins, poly-p-vinylphenol resins, bisphenol A novolac resins, and modified products of these resins.

The phenolic hydroxyl groups contained within these phenol-based resins readily undergo an addition reaction with the epoxy groups of the aforementioned epoxy resin under heating, enabling formation of a cured product having excellent impact resilience. Accordingly, a combination of an epoxy resin and a phenol-based resin may be used.

The binder polymer component imparts an appropriate level of tack to the protection membrane-forming film, thus enhancing the usability of a protection membrane-forming sheet 3. The average molecular weight of the binder polymer component is typically within a range from 50,000 to 2,000,000, preferably from 100,000 to 1,500,000, and more preferably from 200,000 to 1,000,000. In this description, the weight-average molecular weight (Mw) of the binder polymer component describes a value measured by the gel permeation chromatography method (GPC method) and referenced against standard polystyrenes. Details relating to the measurement method are described below in the examples.

If the weight-average molecular weight of the binder polymer is too low, then the film formation of the protection membrane-forming film tends to be unsatisfactory, whereas if the weight-average molecular weight is too high, then the compatibility with other components deteriorates, hindering the formation of a uniform film. Examples of polymers that may be used as the binder polymer include acrylic polymers, polyester resins, phenoxy resins, urethane resins, silicone resins and rubber-based polymers, and acrylic polymers can be used particularly favorably.

Examples of the acrylic polymers include (meth)acrylate ester copolymers containing structural units derived from a (meth)acrylate ester monomer and a (meth)acrylic acid derivative. The (meth)acrylate ester monomer is preferably an alkyl (meth)acrylate ester in which the alkyl group has a carbon number of 1 to 18, and specific examples include methyl (meth)acrylate, ethyl (meth)acrylate, propyl (meth)acrylate and butyl (meth)acrylate. Further, examples of the (meth)acrylic acid derivative include (meth)acrylic acid, glycidyl (meth)acrylate, and hydroxyethyl (meth)acrylate.

Among the above, introducing glycidyl groups into the acrylic polymer by using glycidyl methacrylate or the like as a structural unit improves the compatibility with the epoxy resin used as the aforementioned thermosetting component, and increases the glass transition temperature (Tg) of the protection membrane-forming film following curing, resulting in improved heat resistance. Further, among the above, introducing hydroxyl groups into the acrylic polymer by using hydroxyethyl acrylate or the like as a structural unit enables the adhesion or pressure-sensitive adhesiveness to the workpiece to be better controlled.

The weight-average molecular weight of the polymer in those cases where an acrylic polymer is used as the binder polymer is preferably at least 100,000, and more preferably from 150,000 to 1,000,000. The glass transition temperature of the acrylic polymer is typically not higher than 20° C., and preferably about −70 to 0° C., and the polymer preferably has pressure-sensitive adhesiveness at normal temperature (23° C.).

The blend ratio between the thermosetting component and the binder polymer is adjusted so that relative to 100 parts by mass of the binder polymer, the amount of the thermosetting component is preferably within a range from 50 to 1,500 parts by mass, more preferably from 70 to 1,000 parts by mass, and still more preferably from 80 to 800 parts by mass. By blending the thermosetting component and the binder polymer in this type of ratio, the film exhibits an appropriate level of tack prior to curing, meaning the affixing operation can be performed with good stability, but then yields a protection membrane with excellent coating film strength following curing.

The protection membrane-forming film contains a filler, and the average particle size of the filler within the protection membrane-forming film is not more than 0.4 μm. As a result, the specular glossiness of the protection membrane formed from the protection membrane-forming film can be controlled, and the print legibility of the protection membrane can be enhanced. Further, the light transmittance for prescribed wavelengths and the like can sometimes be more easily controlled so as to satisfy the preferred ranges described below. Furthermore, when the protection membrane-forming film contains a filler, the hardness of the cured protection membrane can be maintained at a higher level, and the moisture resistance can be improved. Moreover, the coefficient of thermal expansion for the cured protection membrane can be brought closer to the coefficient of thermal expansion of the semiconductor wafer, and as a result, warping of the semiconductor wafer during processing can be reduced. The protection membrane-forming film may also include a colorant.

There are no limitations on the specific variety of filler used, provided it satisfies the average particle size condition described above. Examples of the filler include silica such as crystalline silica, fused silica and synthetic silica, and other inorganic fillers such as alumina and glass balloons. Among these, silica is preferred, synthetic silica is more preferred, and a synthetic silica in which α-radiation sources, which are a primary cause of semiconductor device malfunctions, have been removed as much as possible is the most desirable. Examples of the form of the filler include spherical, needle-like and amorphous forms, but a spherical form is preferred, and a perfectly spherical form is particularly preferred. When the filler is spherical or perfectly spherical, diffuse reflection of light is unlikely, and the spectral profile of the light transmittance for the protection membrane-forming film can be more easily controlled.

Further, in addition to the inorganic filler described above, other functional fillers may also be included within the filler added to the protection membrane-forming film. Examples of these functional fillers include conductive fillers added for the purpose of imparting conductivity following die bonding, such as gold, silver, copper, nickel, aluminum, stainless steel, carbon, ceramics, or silver-coated nickel or aluminum, and heat-conducting fillers added for the purpose of imparting thermal conductivity, including metal materials such as gold, silver, copper, nickel, aluminum, stainless steel, silicon and germanium, and alloys of these metals.

As mentioned above, the average particle size of the filler (and particularly the silica filler) is not more than 0.4 µm, and is preferably at least 0.005 µm but not more than 0.3 µm, more preferably at least 0.005 µm but not more than 0.2 µm, still more preferably at least 0.01 µm but not more than 0.15 µm, and most preferably at least 0.01 µm but not more than 0.1 µm. Provided the average particle size is not more than 0.4 µm, the specular glossiness of the protection membrane formed from the protection membrane-forming film can be more easily increased, and the print legibility of the protection membrane can be enhanced. Further, the light transmittance for prescribed wavelengths and the like can sometimes be more easily controlled so as to satisfy the preferred ranges described below. In such cases, other effects such as facilitating the division processing of the workpiece and facilitating infrared transmission inspection of the processed product can also be achieved. If the average particle size of the filler is excessively small, then aggregation becomes more likely, and therefore the average particle size of the filler is preferably at least 0.005 µm.

The amount of the filler (and particularly the silica filler) within the protection membrane-forming film is preferably at least 10% by mass but not more than 80% by mass, more preferably at least 20% by mass but not more than 70% by mass, and still more preferably at least 30% by mass but not more than 65% by mass. Provided the amount of the filler is at least 10% by mass, the print legibility of the protection membrane can be easily enhanced. Further, the light transmittance of the protection membrane-forming film for prescribed wavelengths can sometimes be more easily controlled so as to satisfy the preferred ranges described below. Ensuring that the amount of the filler is not more than 80% by mass makes it easier to improve the print legibility of the protection membrane, and also makes it easier to control the light transmittance of the protection membrane-forming film for prescribed wavelengths so as to satisfy the preferred ranges described below.

Conventional compounds may be used as the colorant, including inorganic pigments, organic pigments and organic dyes, and from the viewpoint of enhancing the controllability of the light transmittance, the colorant preferably includes an organic colorant. From the viewpoint of improving the chemical stability of the colorant (and specifically, the resistance to elution, resistance to color migration, and minimizing color changes over time), the colorant is preferably composed of a pigment. Accordingly, the colorant within the protection membrane-forming film according to the present embodiment is preferably composed of an organic pigment.

Examples of the organic colorants, including organic pigments and organic dyes, include aminium-based colorants, cyanine-based colorants, melocyanine-based colorants, croconium-based colorants, squalium-based colorants, azulenium-based colorants, polymethine-based colorants, naphthoquinone-based colorants, pyrylium-based colorants, phthalocyanine-based colorants, naphthalocyanine-based colorants, naphtholactam-based colorants, azo-based colorants, condensed azo-based colorants, inidigo-based colorants, perinone-based colorants, perylene-based colorants, dioxazine-based colorants, quinacridone-based colorants, isoindolinone-based colorants, quinophthalone-based colorants, pyrrole-based colorants, thioindigo-based colorants, metal complex-based colorants (metal complex dyes), dithiol metal complex-based colorants, indole phenol-based colorants, triarylmethane-based colorants, anthraquinone-based colorants, dioxazine-based colorants, naphthol-based colorants, azomethine-based colorants, benzimidazolone-based colorants, pyranthrone-based colorants, and threne-based colorants.

The organic colorant may be composed of a single material or a plurality of materials. From the viewpoint of facilitating the enhancement of the print legibility of the protection membrane formed from the protection membrane-forming film, and from the viewpoint of facilitating control of the light transmittance of the protection membrane-forming film for prescribed wavelengths so as to satisfy the preferred ranges described below, the colorant in the protection membrane-forming film according to the present embodiment is preferably composed of a plurality of materials.

For example, by blending an isoindolinone yellow pigment, a phthalocyanine blue pigment, and a diketopyrrolopyrrole red pigment in appropriate proportions, the light transmittance of the protection membrane-forming film for prescribed wavelengths can sometimes be more easily controlled so as to satisfy the preferred ranges described below.

Examples of the inorganic pigments include carbon black, cobalt-based colorants, iron-based colorants, chromium-based colorants, titanium-based colorants, vanadium-based colorants, zirconium-based colorants, molybdenum-based colorants, ruthenium-based colorants, platinum-based colorants, ITO (indium tin oxide)-based colorants, and ATO (antimony tin oxide)-based colorants.

The colorant in the protection membrane-forming film according to the present embodiment is preferably composed of an organic colorant and an inorganic colorant.

The amount of the colorant in the protection membrane-forming film is preferably set with due consideration of the thickness of the protection membrane-forming film, and to facilitate enhancement of the print legibility of the protection membrane formed from the protection membrane-forming film, and is more preferably set to facilitate control of the light transmittance of the protection membrane-forming film for prescribed wavelengths so as to satisfy the preferred ranges described below. If the amount of the colorant in the protection membrane-forming film is excessively high, then other physical properties of the protection membrane-forming film such as the adhesiveness to the workpiece tend to deteriorate, and therefore the amount of the colorant is preferably set with due consideration of this point as well.

The are no particular limitations on the average particle size of the colorant. The average particle size is preferably set so as to enhance the print legibility of the protection membrane formed from the protection membrane-forming film, and more preferably set to facilitate control of the light transmittance of the protection membrane-forming film for prescribed wavelengths so as to satisfy the preferred ranges described below. If the average particle size of the colorant is excessively large, then it tends to become difficult to enhance the light transmittance regardless of the wavelength. If the average particle size of the colorant is excessively small, then secondary problems such as difficulty in obtaining the colorant and poor handling properties are more likely to arise. Accordingly, the average particle size of the colorant is preferably from 1 to 500 nm, more preferably from 3 to 100 nm, and still more preferably from 5 to 50 nm. In the present description, the average particle size of the colorant refers to a value measured by a dynamic light scattering method using a particle size distribution analyzer (Nanotrac Wave UT151, manufactured by Nikkiso Co., Ltd.).

The protection membrane-forming film may also include a coupling agent. By including a coupling agent, the adhesiveness or pressure-sensitive adhesiveness of the protection membrane to the workpiece following curing of the protection membrane-forming film can be improved without impairing the heat resistance of the protection membrane, and the water resistance (moist heat resistance) can also be improved. In terms of versatility and cost, a silane coupling agent is preferred as the coupling agent.

Specific examples of the silane coupling agent include γ-glycidoxypropyltrimethoxysilane, γ-glycidoxypropylmethyldiethoxysilane, β-(3,4-epoxycyclohexyl)ethyltrimethoxysilane, γ-(methacryloxypropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidopropyltriethoxysilane, γ-mercaptopropyltrimethoxysilane, γ-mercaptopropylmethyldimethoxysilane, bis(3-triethoxysilylpropyl)tetrasulfan, methyltrimethoxysilane, methyltriethoxysilane, vinyltrimethoxysilane, vinyltriacetoxysilane, and imidazole silane. These silane coupling agents may be used individually, or mixtures of two or more coupling agents may be used.

In order to regulate the cohesion of the protection membrane-forming film prior to curing, the protection membrane-forming film may also include a crosslinking agent such as an organic polyvalent isocyanate compound, an organic polyvalent imine compound or an organic metal chelate compound. Further, in order to suppress static electricity and improve the reliability of the resulting chips, the protection membrane-forming film may also include an antistatic agent. Moreover, in order to improve the flame retardancy of the protection membrane and improve the reliability as a package, the protection membrane-forming film may also include a flame retardant such as a phosphoric acid compound, bromine compound or phosphorus-based compound.

In order to ensure effective functionality as a protection membrane, the thickness of the protection membrane-forming film is preferably from 3 to 300 μm, more preferably from 5 to 200 μm, and still more preferably from 7 to 100 μm.

2. Physical Properties
(1) 60-Degree Specular Glossiness Gs (60°)

The protection membrane formed from the protection membrane-forming film according to the present embodiment preferably has a 60-degree specular glossiness Gs (60°) prescribed in JIS Z 8741:1997 (ISO 2813:1994) that is 40% or higher. In the present description, the 60-degree specular glossiness Gs (60°) means a value measured using a gloss meter VG 2000 manufactured by Nippon Denshoku Industries Co., Ltd. Ensuring that the protection membrane formed from the protection membrane-forming film preferably has a 60-degree specular glossiness Gs (60°) of 40% or higher makes it easier to enhance the print legibility of the protection membrane. From the viewpoint of enhancing the print legibility of the protection membrane in a more stable manner, the 60-degree specular glossiness Gs (60°) is preferably 50% or higher, more preferably 60% or higher, still more preferably 70% or higher, and most preferably 80% or higher. In terms of enhancing the print legibility of the protection membrane, there is no restriction on the upper limit for the 60-degree specular glossiness Gs (60°).

(2) Transmittance

The protection membrane-forming film according to the present embodiment preferably exhibits light transmittance at a wavelength of 550 nm of not more than 20%. In the present description, light transmittance at any wavelength refers to a value measured without using an integrating sphere, and is measured using a spectrophotometer as the measuring instrument.

Using the case where the workpiece is a semiconductor chip as an example, the back surface of the semiconductor chip usually retains grinding traces resulting from back grinding of the semiconductor wafer. If the light transmittance at a wavelength of 550 nm, which represents approximately the center of the visible light region, is restricted to not more than 20% as described above, then the protection membrane-forming film largely inhibits the transmission of visible light. As a result, the grinding traces mentioned above are concealed by the protection membrane-forming film (protection membrane), and are almost impossible to see. This ensures superior external appearance for the processed products such as the semiconductor chips.

From the viewpoint of concealment of the above grinding traces, the light transmittance of the protection membrane-forming film at a wavelength of 550 nm is preferably not more than 15%, and more preferably 10% or less. In terms of concealing the grinding traces, there is no restriction on the lower limit for the light transmittance at a wavelength of 550 nm. However, if the light transmittance at a wavelength of 550 nm is reduced excessively, then it may become difficult to ensure that the light transmittance at a wavelength of 1,064 nm described below is at least 55%, and therefore the lower limit for the light transmittance at a wavelength of 550 nm is typically about 0.1%, and preferably about 0.5%.

The protection membrane-forming film according to the present embodiment preferably exhibits light transmittance at a wavelength of 1,064 nm of at least 50%. In the present description, light transmittance at any wavelength refers to a value measured without using an integrating sphere, and is measured using a spectrophotometer as the measuring instrument.

Ensuring that the light transmittance of the protection membrane-forming film at a wavelength of 1,064 nm is at least 50% facilitates the division processing by modified layer destructive pulling division described below. In the present description, the ease of processing by this modified layer destructive pulling division is also termed "modified destruction processability".

When producing processed products composed of pieces such as semiconductor chips from a workpiece such as a semiconductor wafer, conventionally, division processing has generally been performed by blade dicing, in which a rotary cutting blade is used to divide the workpiece into pieces while a liquid is blown onto the workpiece for the purposes of washing and the like. However, in recent years, division processing by modified layer destructive pulling division, which enables division of a workpiece into pieces using a dry method, has increasingly been employed. In this type of division processing, an infrared laser beam is irradiated onto focus points set within the workpiece, thereby forming a modified layer inside the workpiece, and a force is then applied to the workpiece in which the modified layer has been formed, thereby dividing the workpiece in which the modified layer has been formed and obtaining a plurality of pieces as processed products. In a specific example of this type of division processing, the workpiece is irradiated with a laser beam having a large numerical aperture (NA) so as to form a preliminary modified layer inside the workpiece while suppressing damage to regions near the surface of the workpiece to a minimum, and in a subsequent expansion step or the like, a force is applied to the workpiece to obtain pieces of the workpiece as processed products. One example of a chip production method using modified layer destructive pulling division is the stealth dicing (a registered trademark) method advocated by Hamamatsu Photonics K.K.

From the viewpoint of enhancing the modified destruction processability, the light transmittance of the protection membrane-forming film according to the present embodiment at a wavelength of 1,064 nm is preferably at least 55%, more preferably at least 60%, and still more preferably 65% or higher. In terms of enhancing the modified destruction processability, there is no restriction on the upper limit for the light transmittance of the protection membrane-forming film according to the present embodiment at a wavelength of 1,064 nm.

The protection membrane-forming film according to the present embodiment preferably exhibits light transmittance at a wavelength of 1,250 nm of at least 40%. Ensuring that the light transmittance of the protection membrane-forming film at a wavelength of 1,250 nm is at least 40% facilitates the infrared transmission inspection described below.

Semiconductor chips and the like obtained by dicing a semiconductor wafer sometimes have cracks that have developed due to the stress during processing, or chips or the like generated as a result of impacts with the processing tools such as the rotary cutting blade or other portions (including semiconductor chips) of the semiconductor wafer workpiece (in the present description, these defects are sometimes jointly referred to using the term "cracks and the like"). However, if a protection membrane having the type of light transmittance described above is formed, then cracks and the like that have developed on the protection membrane side of the semiconductor chip cannot be detected by simple visual inspection. Semiconductor chips having cracks and the like which cannot be ignored cause a reduction in the production yield. If the size of the semiconductor chips is too small, then the size of these cracks and the like that cannot be ignored also tends to be smaller.

Provided the light transmittance of the protection membrane-forming film at a wavelength of 1,250 nm is at least 40% as described above, the infrared radiation transmittance of the protection membrane-forming film is particularly favorable, and an infrared radiation inspection can be performed in which the infrared radiation is detected on the side of the protection membrane-forming film (or the protection membrane formed using the protection membrane-forming film). As a result, cracks and the like in the processed products such as semiconductor chips can be detected through the protection membrane-forming film (protection membrane), enabling the production yield to be increased.

From the viewpoint of enhancing the transmittance of infrared radiation through the protection membrane-forming film and facilitating the type of inspection described above, the light transmittance of the protection membrane-forming film according to the present embodiment at a wavelength of 1,250 nm is preferably at least 45%, more preferably at least 50%, and still more preferably 55% or higher. There is no restriction on the upper limit for the light transmittance of the protection membrane-forming film according to the present embodiment at a wavelength of 1,250 nm. However, when the processed products (such as semiconductor chips) on which the protection membrane is formed are used, ensuring that the light transmittance of the protection membrane-forming film at a wavelength of 1,250 nm is not more than 90% can prevent processed product malfunctions caused by the processed products being overly prone to the effects of external infrared radiation.

The protection membrane-forming film according to the present embodiment may be composed of a single layer or a plurality of layers, but in terms of ease of control of the above light transmittance values and production costs, a single layer is preferable. If the protection membrane-forming film is composed of a plurality of layers, then from the viewpoint of ease of control of the light transmittance, it is preferable that the overall film composed of the plurality of layers satisfies the light transmittance values described above.

In those cases where the protection membrane-forming film is composed of an uncured curable adhesive, the light transmittance of the protection membrane-forming film changes very little from before curing to after curing. Accordingly, provided the protection membrane-forming film satisfies any of the above conditions for light transmittance at a specified wavelength prior to curing, the protection membrane obtained by curing the protection membrane-forming film will also satisfy the same light transmittance condition at that wavelength.

(Protection Membrane-Forming Sheet 2)

FIG. 1 is a cross-sectional view of a protection membrane-forming sheet according to an embodiment of the present invention. As illustrated in FIG. 1, the protection membrane-forming sheet 2 includes a protection membrane-forming film 1 and a release sheet 21 laminated to one surface (the lower surface in FIG. 1) of the protection membrane-forming film 1. The release sheet 21 is peeled off when the protection membrane-forming sheet 2 is used.

The release sheet 21 protects the protection membrane-forming film 1 up until the point where the protection membrane-forming sheet 2 is used, and need not necessarily be provided. The composition of the release sheet 21 is arbitrary, and examples include plastic films which exhibit an inherent releasability relative to the protection membrane-forming film 1, and plastic films that have been subjected to a release treatment with a release agent or the like. Specific examples of the plastic films include polyester films such as polyethylene terephthalate, polybutylene terephthalate and polyethylene naphthalate, and polyolefin films such as polypropylene and polyethylene. For the release agent, silicone-based, fluorine-based, and long chain alkyl-based release agents and the like may be used, but among these, silicone-based release agents are preferred, as they are inexpensive and provide stable performance. Although there are no particular limitations on the thickness of the release sheet 21, the thickness is typically about 20 to 250 μm.

The type of release sheet 21 described above may also be laminated to the other surface (the upper surface in FIG. 1) of the protection membrane-forming film 1. In such a case, the peel force for one of the release sheets 21 is preferably increased to form a heavy-peel release sheet, while the peel force of the other release sheet 21 is reduced to form an easy-peel release sheet.

In order to produce the protection membrane-forming sheet 2 according to the present embodiment, the protection membrane-forming film 1 is formed on the release surface (the surface of the release sheet 21 that exhibits releasability, typically a surface that has been subjected to a release treatment, but not limited to such cases) of the release sheet 21. Specifically, a coating agent for forming the protection membrane-forming film is first prepared, containing the curable adhesive that constitutes the protection membrane-forming film 1 and also containing a solvent if required, and this coating agent is then applied to the release surface of the release sheet 21 using a coating device such as a roll coater, knife coater, roll knife coater, air knife coater, die coater, bar coater, gravure coater or curtain coater, and subsequently dried to form the protection membrane-forming film 1.

Using the protection membrane-forming sheet 2 according to the present embodiment, a production method is described below in which chips having a protection membrane formed thereon are produced from a semiconductor wafer as one example of a workpiece. First, the protection membrane-forming film 1 of the protection membrane-forming sheet 2 is affixed to the back surface of a semiconductor wafer having a circuit formed on the surface and a back surface that has been subjected to back grinding. At this time, if required, the protection membrane-forming film 1 may be heated to impart pressure-sensitive adhesiveness.

Subsequently, the release sheet 21 is peeled from the protection membrane-forming film 1. The protection membrane-forming film 1 is then cured to form a protection membrane, thus obtaining a semiconductor wafer with a protection membrane formed thereon. In those cases where the protection membrane-forming film 1 is a thermosetting adhesive, the protection membrane-forming film 1 is heated at a prescribed temperature for an appropriate length of time. The curing of the protection membrane-forming film 1 may also be performed after either the laser printing or the division processing described below.

Having obtained a semiconductor wafer with a protection membrane in this manner, laser printing may be performed if desired, by irradiating a laser beam onto the protection membrane. Alternatively, laser printing may be performed after the division processing described below.

The division processing may be either blade dicing or modified layer destructive pulling division. In the latter case, the semiconductor wafer with the printed protection membrane formed thereon is installed in a division processing laser irradiation apparatus, and following detection of the position of the surface of the semiconductor wafer covered by the protection membrane, a process laser is used to form a modified layer inside the semiconductor wafer. Because the average particle size of the filler contained within the protection membrane-forming film according to the present embodiment is not more than 0.4 µm, in a preferred embodiment, the process laser passes readily through the protection membrane, facilitating the formation of the modified layer inside the semiconductor wafer.

A dicing sheet is then affixed to the surface on the protection membrane side of the laminated body formed in the manner described above from the semiconductor wafer having a modified layer formed therein and the protection membrane. By subsequently performing an expansion step in which the dicing sheet is stretched, a force (a pulling force within the plane of the main surface) is applied to the semiconductor wafer 6 with the protection membrane. As a result, the laminated body affixed to the dicing sheet is divided, yielding chips having the protection membrane formed thereon. Subsequently, a pickup device is used to pick up individual chips having a protection membrane formed thereon from the dicing sheet.

The chips having the protection membrane formed thereon obtained in the above manner exhibit excellent print legibility. Because the average particle size of the filler contained within the protection membrane-forming film according to the present embodiment is not more than 0.4 µm, in a preferred embodiment, the processed products such as the chips can be inspected easily through the protection membrane using infrared radiation, and processed products having cracks and the like can be easily detected. In terms of this ease of infrared inspection, because the average particle size of the filler contained within the protection membrane-forming film is not more than 0.4 µm, infrared inspection through the protection membrane-forming film or the protection membrane can also be performed easily on the workpiece prior to the division processing.

(Protection Membrane-Forming Sheet 3, 3A)

Figure 2:
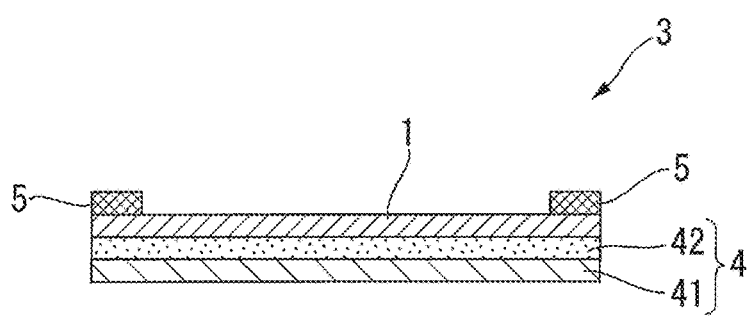
FIG. 2 is a cross-sectional view of a protection membrane-forming sheet according to another embodiment of the present invention.

FIG. 2 is a cross-sectional view of a protection membrane-forming sheet according to another embodiment of the present invention. As illustrated in FIG. 2, a protection membrane-forming sheet 3 according to this embodiment includes a pressure-sensitive adhesive sheet 4 having a pressure-sensitive adhesive layer 42 formed on one surface of a substrate 41, the protection membrane-forming film 1 laminated to the pressure-sensitive adhesive layer 42 side of the pressure-sensitive adhesive sheet 4, and a jig pressure-sensitive adhesive layer 5 laminated around the periphery of the protection membrane-forming film 1 on the opposite side from the pressure-sensitive adhesive sheet 4. The jig pressure-sensitive adhesive layer 5 is a layer for adhering the protection membrane-forming sheet 3 to a jig such as a ring frame or the like.

When processing a workpiece, the protection membrane-forming sheet 3 according to the present embodiment is affixed to the workpiece, thereby holding the workpiece, and is used for forming a protection membrane on the workpiece or the processed product obtained by processing the workpiece. This protection membrane is composed of the protection membrane-forming film 1, and preferably the cured protection membrane-forming film 1.

In one example, the protection membrane-forming sheet 3 according to the present embodiment is used for holding a semiconductor wafer workpiece during dicing processing of the semiconductor wafer, and for forming a protection membrane on the semiconductor chips obtained as a result of the dicing, but the sheet is not limited to this particular use. In this case, the pressure-sensitive adhesive sheet 4 of the protection membrane-forming sheet 3 is typically termed a dicing sheet.

1. Pressure-Sensitive Adhesive Sheet

The pressure-sensitive adhesive sheet 4 of the protection membrane-forming sheet 3 according to the present embodiment includes the substrate 41 and the pressure-sensitive adhesive layer 42 laminated on one surface of the substrate 41.

1-1. Substrate

There are no particular limitations on the construction material of the substrate 41 of the pressure-sensitive adhesive sheet 4, provided the material is suitable for dicing and expanding of the semiconductor wafer, and the substrate is usually composed of a film containing a resin-based material as the main constituent (hereafter referred to as a "resin film").

Specific examples of the resin film include polyethylene films such as low-density polyethylene (LDPE) films, linear low-density polyethylene (LLDPE) films and high-density polyethylene (HDPE) films; polyolefin-based films such as polypropylene films, polybutene films, polybutadiene films, polymethylpentene films, ethylene-norbornene copolymer films and norbornene resin films; ethylene-based copolymer films such as ethylene-vinyl acetate copolymer films, ethylene-(meth)acrylic acid copolymer films and ethylene-(meth)acrylate ester copolymer films; vinyl chloride-based films such as polyvinyl chloride films and vinyl chloride copolymer films; polyester films such as polyethylene terephthalate films and polybutylene terephthalate films; as well as polyurethane films, polyimide films, polystyrene films, polycarbonate films and fluororesin films. Further, modified films of the above films such as crosslinked films and ionomer films can also be used. The substrate 41 may be a film formed from one of the above materials, or may be a laminated film formed from a combination of two or more materials. In the present description, the term "(meth)acrylic acid" means both acrylic acid and methacrylic acid. Other similar terms are similarly defined.

Among the above, from the viewpoints of environmental stability and cost and the like, a polyolefin-based film is preferred, and of these, a polypropylene film which exhibits excellent heat resistance is particularly desirable. A polypropylene film is able to impart heat resistance to the substrate 41 without impairing the suitability of the pressure-sensitive adhesive sheet 4 to expansion, and the ease of pick up. Ensuring that the substrate 41 has this type of heat resistance suppresses sagging of the pressure-sensitive adhesive sheet 4, even when the protection membrane-forming film 1 is subjected to thermosetting in a state where the protection membrane-forming sheet 3 is affixed to the workpiece.

If desired, either one surface or both surfaces of the above resin film may be subjected to either a surface treatment using an oxidation method or a roughening method, or a primer treatment, for the purpose of improving the adhesion to the pressure-sensitive adhesive layer 42 laminated to the surface of the resin film. Examples of the oxidation method include a corona discharge treatment, plasma discharge treatment, chromium oxidation treatment (wet), flame treatment, hot air treatment, ozone treatment and ultraviolet irradiation treatment, whereas examples of the roughening method include a sandblasting method and a thermal spraying method.

The substrate 41 may also include any of various additives such as colorants, flame retardants, plasticizers, antistatic agents, lubricants and fillers within the resin film described above.

There are no particular limitations on the thickness of the substrate 41, provided the substrate functions satisfactorily in each of the steps in which the protection membrane-forming sheet 3 is used, but the thickness if preferably within a range from 20 to 450 μm, more preferably from 25 to 400 μm, and still more preferably from 50 to 350 μm.

The breaking elongation of the substrate 41 of the pressure-sensitive adhesive sheet 4 in the present embodiment is preferably at least 100%, and more preferably from 200 to 1,000%, when measured at 23° C. and a relative humidity of 50%. The breaking elongation is measured in accordance with the tensile test prescribed in JIS K 7161:1994 (ISO 527-1 1993), and describes the degree of elongation in a test piece relative to the original length at the point of breakage of the test piece. A substrate 41 having a breaking elongation of at least 100% is resistant to breakage during the expansion step, and facilitates separation of the chips formed by cutting the workpiece.

Further, the tensile stress at 25% strain for the substrate 41 of the pressure-sensitive adhesive sheet 4 according to the present embodiment is preferably within a range from 5 to 15 N/10 mm, and the maximum tensile stress is preferably from 15 to 50 MPa. The tensile stress at 25% strain and the maximum tensile stress are measured using the tests prescribed in JIS K 7161:1994. Provided the tensile stress at 25% strain is at least 5 N/10 mm and the maximum tensile stress is at least 15 MPa, sagging of the substrate 2 is suppressed when the workpiece is affixed to the dicing sheet 1 and then secured to a frame such as a ring frame, and transport errors can be prevented from occurring. On the other hand, provided the tensile stress at 25% strain is not more than 15 N/10 mm and the maximum tensile stress is not more than 50 MPa, peeling of the dicing sheet 1 itself from the ring frame during the expansion step can be suppressed. The breaking elongation, the tensile stress at 25% strain, and the maximum tensile stress described above indicate values measured in the lengthwise direction of the base material of the substrate 41.

1-2. Pressure-Sensitive Adhesive Layer

The pressure-sensitive adhesive layer 42 of the pressure-sensitive adhesive sheet 4 of the protection membrane-forming sheet 3 according to the present embodiment may be composed of a non-energy ray-curable pressure-sensitive adhesive or an energy ray-curable pressure-sensitive adhesive. The non-energy ray-curable pressure-sensitive adhesive preferably has the desired levels of adhesive force and removability, and examples include acrylic-based pressure-sensitive adhesives, rubber-based pressure-sensitive adhesives, silicone-based pressure-sensitive adhesives, urethane-based pressure-sensitive adhesives, polyester-based pressure-sensitive adhesives, and polyvinyl ether-based pressure-sensitive adhesives. Among these, acrylic-based pressure-sensitive adhesives are preferred, as they exhibit good adhesion to the protection membrane-forming film 1, and effectively inhibit the detachment of the workpiece or the processed product during the dicing step and the like.

On the other hand, energy ray-curable pressure-sensitive adhesives exhibit a reduction in adhesive force when irradiated with energy rays, and therefore when the pressure-sensitive adhesive sheet 4 requires separation from the workpiece or the processed product, separation can be performed easily by irradiation of energy rays.

When the pressure-sensitive adhesive layer 42 is composed of an energy ray-curable pressure-sensitive adhesive, the pressure-sensitive adhesive layer 42 in the protection membrane-forming sheet 3 is preferably cured. A material composed of a cured energy ray-curable pressure-sensitive adhesive usually has a high elastic modulus and a high degree of surface smoothness, and therefore when the protection membrane-forming sheet 3 that is in contact with the cured portion of this material is cured to form the protection membrane, the surface of the protection membrane where it contacts the cured portion exhibits superior smoothness (gloss), resulting in a chip protection membrane having excellent aesthetics. Further, when laser printing is performed on such a protection membrane having superior surface smoothness, the legibility of the printing improves.

The energy ray-curable pressure-sensitive adhesive that constitutes the pressure-sensitive adhesive layer 42 may contain a polymer having energy ray curability as the main component, or may contain a mixture of a polymer having no energy ray curability and an energy ray-curable polyfunctional monomer and/or oligomer as the main component.

The case in which the energy ray-curable pressure-sensitive adhesive contains a polymer having energy ray curability as the main component is described below.

The polymer having energy ray curability is preferably a (meth)acrylate ester (co)polymer (A) (hereafter also referred to as the "energy ray-curable polymer (A)") in which functional groups having energy ray curability (energy ray-curable groups) have been introduced as side chains. This energy ray-curable polymer (A) is preferably obtained by reacting a (meth)acrylic-based copolymer (a1) having functional group-containing monomer units, and an unsaturated group-containing compound (a2) having a substituent that bonds to that functional group.

The acrylic-based copolymer (a1) is formed from a structural unit derived from a functional group-containing monomer, and a (meth)acrylate ester monomer or a derivative thereof.

The functional group-containing monomer that functions as a structural unit for the acrylic-based copolymer (a1) is preferably a monomer having a polymerizable double bond, and a functional group such as a hydroxyl group, amino group, substituted amino group or epoxy group within each molecule.

More specific examples of the functional group-containing monomer include 2-hydroxyethyl (meth)acrylate, 2-hydroxypropyl (meth)acrylate, 3-hydroxypropyl (meth)acrylate and 4-hydroxybutyl (meth)acrylate, and these compounds may be used individually or in combinations containing two or more compounds.

Examples of compounds that may be used as the (meth)acrylate ester monomer that is used in forming the acrylic-based copolymer (a1) include alkyl (meth)acrylates in which the alkyl group has a carbon number of 1 to 20, cycloalkyl (meth)acrylates, and benzyl (meth)acrylate. Among these, alkyl (meth)acrylates in which the alkyl group has a carbon number of 1 to 18 are particularly preferred, and specific examples include methyl (meth)acrylate, ethyl (meth)acrylate, propyl (meth)acrylate, n-butyl (meth)acrylate, and 2-ethylhexyl (meth)acrylate.

The acrylic-based copolymer (a1) typically contains 3 to 100% by mass, and preferably 5 to 40% by mass, of structural units derived from the above functional group-containing monomer, and typically contains 0 to 97% viscosity mass, and preferably 60 to 95% by mass, of structural units derived from the (meth)acrylate ester monomer or derivative thereof.

The acrylic-based copolymer (a1) can be obtained by copolymerization of the functional group-containing monomer and the (meth)acrylate ester monomer or derivative thereof using typical methods, and other compounds besides these monomers, such as dimethylacrylamide, vinyl formate, vinyl acetate or styrene, may also be copolymerized.

The energy ray-curable polymer (A) can be obtained by reacting the acrylic-based copolymer (a1) having the aforementioned functional group-containing monomer units with the unsaturated group-containing compound (a2) having a substituent that bonds to that functional group.

The substituent of the unsaturated group-containing compound (a2) may be selected appropriately in accordance with the type of functional group within the functional group-containing monomer units of the acrylic-based copolymer (a1). For example, if the functional group is a hydroxyl group, amino group or substituted amino group, then an isocyanate group or epoxy group is preferred as the substituent, whereas if the functional group is an epoxy group, then an amino group, carboxyl group or aziridinyl group is preferred as the substituent.

Further, the unsaturated group-containing compound (a2) typically contains 1 to 5, and preferably 1 to 2, energy ray-curable carbon-carbon double bonds within each molecule. Specific examples of this type of unsaturated group-containing compound (a2) include 2-(meth)acryloyloxyethyl isocyanate, meta-isopropenyl-α,α-dimethylbenzyl isocyanate, (meth)acryloyl isocyanate, allyl isocyanate, 1,1-(bis(meth)acryloyloxymethyl)ethyl isocyanate, acryloyl monoisocyanate compounds obtained by reacting a diisocyanate compound or a polyisocyanate compound with hydroxyethyl (meth)acrylate, acryloyl monoisocyanate compounds obtained by reacting a diisocyanate compound or a polyisocyanate compound with a polyol compound and hydroxyethyl (meth)acrylate, glycidyl (meth)acrylate, (meth)acrylic acid, 2-(1-aziridinyl)ethyl (meth)acrylate, 2-vinyl-2-oxazoline, and 2-isopropenyl-2-oxazoline.

The unsaturated group-containing compound (a2) is typically used in a ratio of 10 to 100 equivalents, and preferably 20 to 95 equivalents, per 100 equivalents of the functional group-containing monomer of the acrylic-based copolymer (a1) described above.

In the reaction between the acrylic-based copolymer (a1) and the unsaturated group-containing compound (a2), the reaction temperature, pressure, solvent and time, the presence or absence of a catalyst, and the type of catalyst may all be selected appropriately in accordance with the combination of the functional group and the substituent. As a result, the functional groups that exist within the acrylic-based copolymer (a1) and the substituent within the unsaturated group-containing compound (a2) react, unsaturated groups are introduced as side chains within the acrylic-based copolymer (a1), and the energy ray-curable polymer (A) is obtained.

The weight-average molecular weight of the energy ray-curable polymer (A) obtained in this manner is preferably at least 10,000, preferably from 150,000 to 1,500,000, and more preferably from 200,000 to 1,000,000. In this description, the weight-average molecular weight (Mw) of the energy ray-curable polymer (A) describes a value measured by the gel permeation chromatography method (GPC method) and referenced against standard polystyrenes.

Even in those cases where the energy ray-curable pressure-sensitive adhesive contains a polymer having energy ray curability as the main component, the energy ray-curable pressure-sensitive adhesive may also contain an energy ray-curable monomer and/or oligomer (B).

Examples of compounds that may be used as the energy ray-curable monomer and/or oligomer (B) include esters of a polyhydric alcohol and (meth)acrylic acid.

Specific examples of the energy ray-curable monomer and/or oligomer (B) include monofunctional acrylate esters such as cyclohexyl (meth)acrylate and isobornyl (meth)acrylate, polyfunctional acrylate esters such as trimethylolpropane tri(meth)acrylate, pentaerythritol tri(meth)acrylate, pentaerythritol tetra(meth)acrylate, dipentaerythritol hexa(meth)acrylate, 1,4-butanediol di(meth)acrylate, 1,6-hexanediol di(meth)acrylate, polyethylene glycol di(meth)acrylate and dimethyloltricyclodecane di(meth)acrylate, as well as polyester oligo(meth)acrylates and polyurethane oligo(meth)acrylates.

In those cases where the energy ray-curable monomer and/or oligomer (B) is added, the amount of the energy ray-curable monomer and/or oligomer (B) within the energy ray-curable pressure-sensitive adhesive is preferably from 5 to 80% by mass, and more preferably from 20 to 60% by mass.

In those cases where ultraviolet rays are used as the energy rays used for curing the energy ray-curable resin composition, a photopolymerization initiator (C) is preferably added, and using this photopolymerization initiator (C) enables the polymer curing time and the light irradiation dose to be reduced.

Specific examples of the photopolymerization initiator (C) include benzophenone, acetophenone, benzoin, benzoin methyl ether, benzoin ethyl ether, benzoin isopropyl ether, benzoin isobutyl ether, benzoin benzoic acid, methyl benzoin benzoate, benzoin dimethyl ketal, 2,4-diethylthioxanthone, 1-hydroxycyclohexyl phenyl ketone, benzyl diphenyl sulfide, tetramethylthiuram monosulfide, azobisisobutyronitrile, benzil, dibenzil, diacetyl, β-chloroanthraquinone, (2,4,6-trimethylbenzyldiphenyl) phosphine oxide, 2-benzothiazole-N,N-diethyldithiocarbamate, oligo{2-hydroxy-2-methyl-1-[4-(1-propenyl)phenyl]propanone} and 2,2-dimethoxy-1,2-diphenylethan-1-one. These compounds may be used individually, or combinations of two or more compounds may be used.

The photopolymerization initiator (C) is typically used in an amount of 0.1 to 10 parts by mass, and preferably 0.5 to 6 parts by mass, per 100 parts by mass of the energy ray-curable copolymer (A) (or in the case where the energy ray-curable monomer and/or oligomer (B) is added, 100 parts by mass of the combination of the energy ray-curable copolymer (A) and the energy ray-curable monomer and/or oligomer (B)).

The energy ray-curable pressure-sensitive adhesive may also include other suitable components in addition to the components described above. Examples of these other components include a polymer component or oligomer component (D) that does not have energy ray curability, and a crosslinking agent (E).

Examples of the polymer component or oligomer component (D) that does not have energy ray curability include polyacrylate esters, polyesters, polyurethanes, polycarbonates and polyolefins, and polymers or oligomers having a weight-average molecular weight (Mw) of 3,000 to 2,500,000 are preferable.

Polyfunctional compounds that exhibit reactivity with the functional groups of the energy ray-curable copolymer (A) can be used as the crosslinking agent (E). Specific examples of such compounds include isocyanate compounds, epoxy compounds, amine compounds, melamine compounds, aziridine compounds, hydrazine compounds, aldehyde compounds, oxazoline compounds, metal alkoxide compounds, metal chelate compounds, metal salts, ammonium salts and reactive phenol resins.

By including these types of other components (D) and (E) within the energy ray-curable pressure-sensitive adhesive, properties such as the viscosity and releasability prior to curing, and the strength, adhesiveness to other layers, and storage stability and the like following curing can be improved. There are no particular limitations on the amounts added of these other components, and the amounts may be set appropriately within a range from 0 to 40 parts by mass per 100 parts by mass of the energy ray-curable copolymer (A).

Next is a description of the case in which the energy ray-curable pressure-sensitive adhesive contains a mixture of a polymer component having no energy ray curability and an energy ray-curable polyfunctional monomer and/or oligomer as the main component.

For the polymer component having no energy ray curability, the same components as those described above for the acrylic-based copolymer (a1) can be used. The amount of the polymer component having no energy ray curability within the energy ray-curable resin composition is preferably from 20 to 99.9% by mass, and more preferably from 30 to 80% by mass.

For the energy ray-curable polyfunctional monomer and/or oligomer, the same compounds as those described above for the component (B) can be used. The blend ratio between the polymer component having no energy ray curability and the energy ray-curable polyfunctional monomer and/or oligomer is preferably set so that the amount of the polyfunctional monomer and/or oligomer is from 10 to 150 parts by mass, and more preferably from 25 to 100 parts by mass, per 100 parts by mass of the polymer component.

The photopolymerization initiator (C) and the crosslinking agent (E) may also be added in this case, in a similar manner to that described above.

There are no particular limitations on the thickness of the pressure-sensitive adhesive layer 42, provided it is capable of functioning appropriately in each of the steps in which the protection membrane-forming sheet 3 is used. Specifically, the thickness is preferably from 1 to 50 μm, more preferably from 2 to 30 μm, and still more preferably from 3 to 20 μm.

The pressure-sensitive adhesive that constitutes the jig pressure-sensitive adhesive layer 5 is preferably an adhesive having the desired levels of adhesive force and removability, and examples of pressure-sensitive adhesives that may be used include acrylic-based pressure-sensitive adhesives, rubber-based pressure-sensitive adhesives, silicone-based pressure-sensitive adhesives, urethane-based pressure-sensitive adhesives, polyester-based pressure-sensitive adhesives, and polyvinyl ether-based pressure-sensitive adhesives. Among these, acrylic-based pressure-sensitive adhesives are preferred, as they exhibit good adhesion to the jig such as the ring frame, and effectively inhibit the detachment of the protection membrane-forming sheet 3 from the ring frame or the like during the dicing step and the like. A base material that functions as a core may be interposed partway through the thickness direction of the jig pressure-sensitive adhesive layer 5.

On the other hand, from the viewpoint of the adhesiveness to the jig such as the ring frame, the thickness of the jig pressure-sensitive adhesive layer 5 is preferably from 5 to 200 μm, and more preferably from 10 to 100 μm.

2. Production Method for Protection Membrane-Forming Sheet 3

The protection membrane-forming sheet 3 is preferably produced by separately preparing a first laminated body containing the protection membrane-forming film 1 and a second laminated body containing the pressure-sensitive adhesive sheet 4, and then subsequently using the first laminated body and the second laminated body to laminate the protection membrane-forming film 1 and the pressure-sensitive adhesive sheet 4, but the present invention is not limited to this method.

In order to produce the first laminated body, the protection membrane-forming film 1 is formed on the release surface of a first release sheet. Specifically, a coating agent for forming the protection membrane-forming film is first prepared, containing the curable adhesive that constitutes the protection membrane-forming film 1 and also containing a solvent if required, and this coating agent is then applied to the release surface of the first release sheet using a coating device such as a roll coater, knife coater, roll knife coater, air knife coater, die coater, bar coater, gravure coater or curtain coater, and subsequently dried to form the protection membrane-forming film 1. Subsequently, the release surface of a second release sheet is overlaid on the exposed surface of the protection membrane-forming film 1 and the resulting structure is crimped, thus forming a laminated body (the first laminated body) in which the protection membrane-forming film 1 is sandwiched between the two release sheets.

If desired, this first laminated body may be subjected to half cutting to form the protection membrane-forming film 1 (and the second release sheet) into a desired shape such as a circular shape. In such a case, the excess portions of the protection membrane-forming film 1 and the second release sheet produced as a result of the half cutting may be removed appropriately.

On the other hand, in order to produce the second laminated body, a coating agent for forming the pressure-sensitive adhesive layer, containing the pressure-sensitive adhesive that constitutes the pressure-sensitive adhesive layer 42 and also containing a solvent if required, is applied to the release surface of a third release sheet, and the coating agent is then dried to form the pressure-sensitive adhesive layer 42. Subsequently, the substrate 41 is crimped to the exposed surface of the pressure-sensitive adhesive layer 42, thus obtaining a laminated body (the second laminated body) containing the pressure-sensitive adhesive sheet 4 composed of the substrate 41 and the pressure-sensitive adhesive layer 42, and the third release sheet.

In those cases where the pressure-sensitive adhesive layer 42 is formed from an energy ray-curable pressure-sensitive adhesive, energy rays may be irradiated onto the pressure-sensitive adhesive layer 42 at this stage to cure the pressure-sensitive adhesive layer 42, or the pressure-sensitive adhesive layer 42 may be cured after lamination of the protection membrane-forming film 1. Further, in those cases where the pressure-sensitive adhesive layer 42 is cured after lamination of the protection membrane-forming film 1, the pressure-sensitive adhesive layer 42 may be cured either before the dicing step or after the dicing step.

Ultraviolet rays or an electron beam or the like are typically used as the energy rays. The irradiation dose of the energy rays differs depending on the type of energy rays used, but in the case of ultraviolet rays, a dose of 50 to 1,000 mJ/cm$^2$ is preferred, and a dose of 100 to 500 mJ/cm$^2$ is even more desirable. In the case of an electron beam, a dose of about 10 to 1,000 krad is preferred.

Once the first laminated body and the second laminated body have been obtained in the manner described above, the second release sheet in the first laminated body and the third release sheet in the second laminated body are peeled off, and the protection membrane-forming film 1 exposed within the first laminated body and the pressure-sensitive adhesive layer 42 of the pressure-sensitive adhesive sheet 4 exposed in the second laminated body are superimposed and crimped together. If desired, the pressure-sensitive adhesive sheet 4 may be subjected to half cutting to form a desired shape, for example a circular shape having a diameter that is larger than the protection membrane-forming film 1. In such a case, the excess portions of the pressure-sensitive adhesive sheet 4 produced as a result of the half cutting may be removed appropriately.

In this manner, the protection membrane-forming sheet 3 can be obtained, composed of the pressure-sensitive adhesive sheet 4 containing the pressure-sensitive adhesive layer 42 laminated to the substrate 41, the protection membrane-forming film 1 laminated to the pressure-sensitive adhesive layer 42 side of the pressure-sensitive adhesive sheet 4, and the first release sheet that is laminated to the opposite side of the protection membrane-forming film 1 from the pressure-sensitive adhesive sheet 4. Finally, the first release sheet is peeled off, and the jig pressure-sensitive adhesive layer 5 is formed around the periphery of the protection membrane-forming film 1 on the opposite side from the pressure-sensitive adhesive sheet 4. The jig pressure-sensitive adhesive layer 5 can be formed by a coating process using the same method as that described above for the pressure-sensitive adhesive layer 42.

3. Method for Using Protection Membrane-Forming Sheet 3

Using the protection membrane-forming sheet 3 according to the present embodiment, a method for producing chips (processed products) having a protection membrane formed thereon from a semiconductor wafer workpiece using a production method that includes division processing by modified layer destructive pulling division is described below as one example of a method of using the protection membrane-forming sheet 3.

Figure 4:
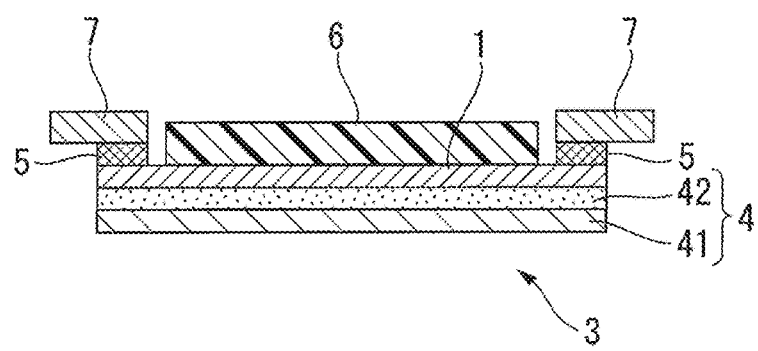
FIG. 4 illustrates an example of using a protection membrane-forming sheet according to an embodiment of the present invention, and more specifically, illustrates a cross-sectional view of a first laminated structure.
Figure 5:
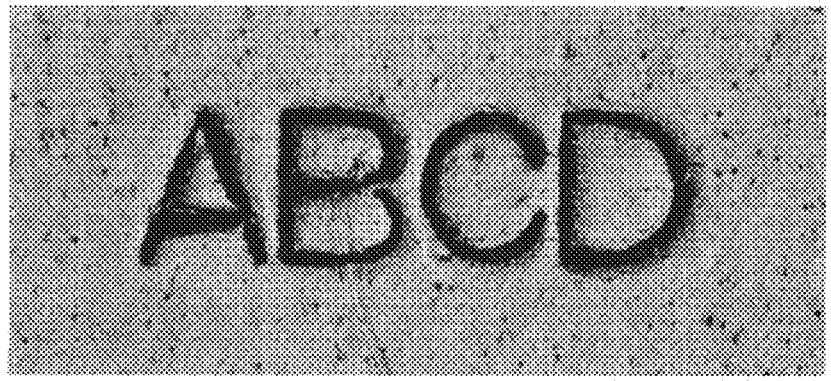
FIG. 5 is an image showing the results of observing a printed protection membrane according to Example 1.
Figure 6:
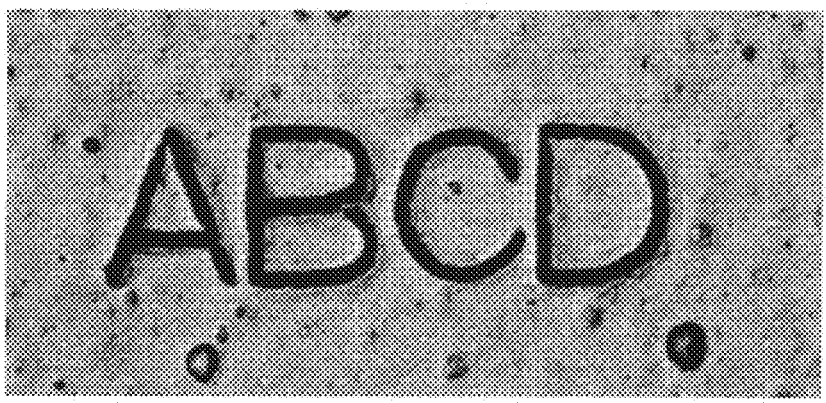
FIG. 6 is an image showing the results of observing a printed protection membrane according to Example 3.
Figure 7:
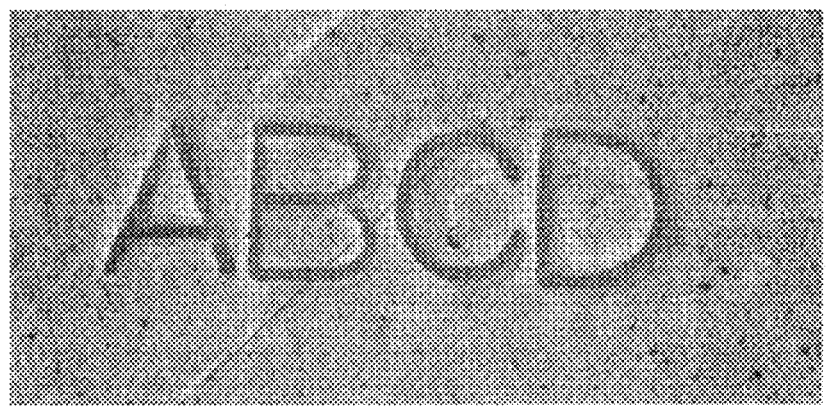
FIG. 7 is an image showing the results of observing a printed protection membrane according to Example 4.
Figure 8:
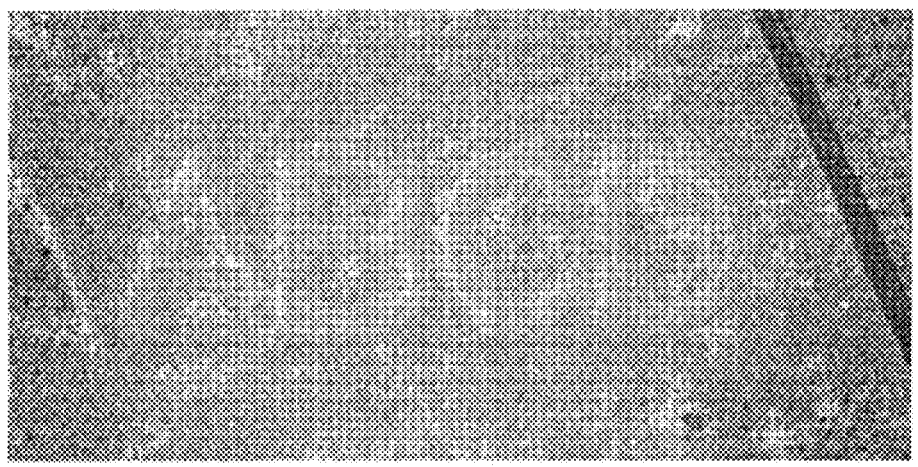
FIG. 8 is an image showing the results of observing a printed protection membrane according to Comparative Example 1.

As illustrated in FIG. 4, the protection membrane-forming film 1 of the protection membrane-forming sheet 3 is affixed to a semiconductor wafer 6, and the jig pressure-sensitive adhesive layer 5 is affixed to a ring frame 7. When affixing the protection membrane-forming film 1 to the semiconductor wafer 6, the protection membrane-forming film 1 may be heated if required to impart pressure-sensitive adhesiveness.

Subsequently, the protection membrane-forming film 1 is cured to form a protection membrane, and a first laminated structure is obtained with a configuration in which the semiconductor wafer 6 with a protection membrane formed thereon is laminated to the pressure-sensitive adhesive layer 42 side of the pressure-sensitive adhesive sheet 4 which functions as an expandable dicing sheet (in this description, this laminated structure is also referred to as the "first laminated structure"). The first laminated structure illustrated in FIG. 4 also includes the jig pressure-sensitive adhesive layer 5 and the ring frame 7. In those cases where the protection membrane-forming film 1 is a thermosetting adhesive, the protection membrane-forming film 1 is heated at a prescribed temperature for an appropriate length of time. The curing of the protection membrane-forming film 1 may also be performed after either the laser printing or the division processing described below.

Having obtained the first laminated structure containing the semiconductor wafer 6 with the protection membrane formed thereon, laser printing may be performed if desired, by irradiating a laser beam onto the protection membrane through the pressure-sensitive adhesive sheet 4. In this manner, the protection membrane-forming sheet can be used to form a protection membrane on a workpiece, and the surface of the workpiece on which this protection membrane has been formed can then be irradiated with a laser beam to produce a workpiece having a printed protection membrane formed thereon. Alternatively, the laser printing may be performed after the division processing described below.

Subsequently, the first laminated structure is installed in a division processing laser irradiation apparatus, and following detection of the position of the surface of the semiconductor wafer 6 covered by the protection membrane 1, a process laser is used to form a modified layer inside the semiconductor wafer 6. By subsequently performing an expansion step in which the pressure-sensitive adhesive sheet 4 that functions as a dicing sheet is stretched, a force (a pulling force within the plane of the main surface) is applied to the semiconductor wafer 6 having the protection membrane. As a result, the semiconductor wafer 6 with the protection membrane affixed to the pressure-sensitive adhesive sheet 4 is divided, yielding chips having a protection membrane. Subsequently, a pickup device is used to pick up individual chips having a protection membrane from the pressure-sensitive adhesive sheet 4.

The laser irradiation used for performing printing may also be performed on the chips having a protection membrane formed thereon, rather than on the semiconductor wafer 6 with the protection membrane formed thereon. In other words, the protection membrane-forming sheet may be used to form a protection membrane on the workpiece (the semiconductor wafer 6), this workpiece (the semiconductor wafer 6) with the protection membrane formed thereon may then be processed to obtain processed products (chips) having a protection membrane formed thereon, and the surface of these processed products (chips) on which the protection membrane has been formed may then be irradiated with a laser beam to produce processed products (chips) having a printed protection membrane formed thereon.

Regardless of whether the item to which the protection membrane according to an embodiment of the present invention is adhered is a workpiece (the semiconductor wafer 6) or a processed product (chip), because the protection membrane contains a filler having an average particle size of not more than 0.4 μm, the print legibility is excellent.

4. Other Embodiment of the Protection Membrane-Forming Sheet

Figure 3:
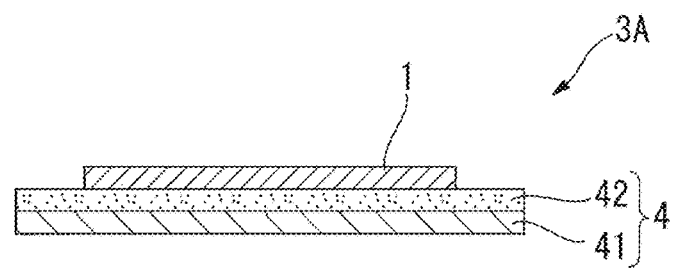
FIG. 3 is a cross-sectional view of a protection membrane-forming sheet according to yet another embodiment of the present invention.

FIG. 3 is a cross-sectional view of a protection membrane-forming sheet according to yet another embodiment of the present invention. As illustrated in FIG. 3, a protection membrane-forming sheet 3A according to this embodiment includes the pressure-sensitive adhesive sheet 4 having the pressure-sensitive adhesive layer 42 formed on one surface of the substrate 41, and the protection membrane-forming film 1 laminated to the pressure-sensitive adhesive layer 42 side of the pressure-sensitive adhesive sheet 4. The protection membrane-forming film 1 in this embodiment is formed of a size that is either approximately the same as, or slightly larger than, the workpiece in the in-plane direction, but smaller than the pressure-sensitive adhesive sheet 4 in the in-plane direction. The portions of the pressure-sensitive adhesive layer 42 to which the protection membrane-forming film 1 is not laminated can be used for affixing a jig such as a ring frame.

The material and thickness of each of the members of the protection membrane-forming sheet 3A according to the present embodiment may be the same as the material and thickness of each of the members of the protection membrane-forming sheet 3 described above. However, in those cases where the pressure-sensitive adhesive layer 42 is an energy ray-curable pressure-sensitive adhesive, it is preferable that the energy ray-curable pressure-sensitive adhesive is cured in those portions of the pressure-sensitive adhesive layer 42 that contact the protection membrane-forming film 1, but the energy ray-curable pressure-sensitive adhesive is not cured in the remaining portions. This enables the smoothness (gloss) of the protection membrane formed by curing the protection membrane-forming film 1 to be enhanced, while maintaining superior adhesive force to the jig such as the ring frame.

A jig pressure-sensitive adhesive layer similar to the jig pressure-sensitive adhesive layer 5 of the protection membrane-forming sheet 3 described above may be separately provided around the periphery of the pressure-sensitive adhesive layer 42 of the protection membrane-forming sheet 3A on the opposite side from the substrate 41.

The embodiments described above have been presented in order to facilitate comprehension of the present invention, but do not limit the present invention in any way. Accordingly, the various elements described in the above embodiments are deemed to include all the various design modifications and equivalent items included within the technical scope of the present invention.

For example, a release sheet may also be laminated to the protection membrane-forming film 1 of the protection membrane-forming sheet 3 or 3A on the opposite side from the pressure-sensitive adhesive sheet 4.

EXAMPLES

The present invention is described below in further detail using a series of examples and the like, but the scope of the present invention is in no way limited by these examples and the like.

Example 1

The components listed below were mixed together in the blend ratio (solid fraction amounts) shown in Table 1, and then the mixture was diluted with methyl ethyl ketone to achieve a solid fraction concentration of 61% by mass, thus preparing a coating agent for a protection membrane-forming film.

(A) Polymer component: an acrylic-based polymer (weight-average molecular weight: 400,000, glass transition temperature: −1° C.) obtained by copolymerizing 10 parts by mass of n-butyl acrylate, 70 parts by mass of methyl acrylate, 5 parts by mass of glycidyl methacrylate and 15 parts by mass of 2-hydroxyethyl acrylate (B-1) Bisphenol A epoxy resin (jER828, manufactured by Mitsubishi Chemical Corporation, liquid at 23° C. and 1 atm, molecular weight: 370, softening point: 93° C., epoxy equivalent weight: 183 to 194 g/eq)

(B-2) Bisphenol A epoxy resin (jER1055, manufactured by Mitsubishi Chemical Corporation, solid at 23° C. and 1 atm, molecular weight: 1,600, epoxy equivalent weight: 800 to 900 g/eq)

(B-3) Dicyclopentadiene epoxy resin (EPICLON HP-7200HH, manufactured by DIC Corporation, solid at 23° C. and 1 atm, softening point: 88 to 98° C., epoxy equivalent weight: 255 to 260 g/eq)

(C-1) Heat-activated latent epoxy resin curing agent (dicyandiamide (ADEKA HARDNER EH-3636AS, manufactured by ADEKA Corporation, amount of active hydrogen: 21 g/eq))

(C-2) Heat-activated latent epoxy resin curing agent (dicyandiamide (DICY7, manufactured by Mitsubishi Chemical Corporation))

(D) Curing accelerator: 2-phenyl-4,5-dihydroxymethylimidazole (CUREZOL 2PHZ, manufactured by Shikoku Corporation)

(E-1) Silica filler (YA050CMJA, manufactured by Admatechs Co., Ltd., average particle size: 0.05 μm)

(E-2) Silica filler (SC2050MA, manufactured by Admatechs Co., Ltd., average particle size: 0.5 μm)

(E-3) Silica filler (YC100CMLA, manufactured by Admatechs Co., Ltd., average particle size: 0.1 μm)

(E-4) Silica filler (a filler obtained by subjecting SC1050, manufactured by Admatechs Co., Ltd., to a vinyl group surface modification using a silane coupling agent KBM1003 manufactured by Shin-Etsu Chemical Co., Ltd., average particle size: 0.3 μm)

(F) Silane coupling agent (KBM403, manufactured by Shin-Etsu Chemical Co., Ltd.)

(G-1) Colorant (blue pigment): a pigmented styrene-acrylic resin prepared using a mass ratio of 1/3 of a phthalocyanine-based blue colorant (Pigment Blue 15:3) as the colorant component relative to the resin (G-2) Colorant (yellow pigment): a pigmented styrene-acrylic resin prepared using a mass ratio of 1/3 of an isoindolinone-based yellow colorant (Pigment Yellow 139) as the colorant component relative to the resin (G-3) Colorant (red pigment): a pigmented styrene-acrylic resin prepared using a mass ratio of 1/3 of a diketopyrrolopyrrole-based red colorant (Pigment Red 264) as the colorant component relative to the resin (H) Colorant: carbon black (MA600B, manufactured by Mitsubishi Chemical Corporation, average particle size: 28 nm)

Here, the weight-average molecular weight (Mw) of the polymer component (A) represents the polystyrene-equivalent weight-average molecular weight measured by gel permeation chromatography (GPC) under the conditions described below.

<GPC Measurement Conditions>
  Columns: TSKgel GMHXL (two), TSKgel 200HXL linked in this sequence
  Solvent: THF
  Measurement temperature: 40° C.
  Flow rate: 1 ml/minute
  Detector: refractive index detector
  Standard samples: polystyrene A first release sheet (SP-PET382150, manufactured by Lintec Corporation, thickness: 38 μm) composed of a silicone-based release layer formed on one surface of a polyethylene terephthalate (PET) film, and a second release sheet (SP-PET381031, manufactured by Lintec Corporation, thickness: 38 μm) composed of a silicone-based release layer formed on one surface of a PET film were prepared.

Following application of the aforementioned coating agent for a protection membrane-forming film with a knife coater to the release surface of the first release sheet in an amount sufficient to obtain a final protection membrane-forming film with a thickness of 23 μm, the film was dried for 2 minutes in an oven at 120° C., thus forming a protection membrane-forming film. Subsequently, the release surface of the second release sheet was overlaid on the protection membrane-forming film, and the two were stuck together, thus forming a protection membrane-forming sheet composed of the first release sheet (the release sheet 21 in FIG. 1), the protection membrane-forming film (the protection membrane-forming film 1 in FIG. 1) (thickness: 25 μm), and the second release sheet.

Examples 2 to 7, and Comparative Examples 1 to 3

With the exception of altering the components used in forming the protection membrane-forming film and the amount of each component as shown in Table 1, protection membrane-forming sheets were produced in the same manner as that described for Example 1.

[Test Example 1]<Measurement of 60-Degree Specular Glossiness>

The second release sheet was peeled from the protection membrane-forming sheet obtained in each of the examples and comparative examples, and the protection membrane-forming film was affixed to the polished surface of a semiconductor wafer (#200 polishing, diameter: 200 mm, thickness: 280 μm). A tape mounter (Adwill RAD-3600, manufactured by Lintec Corporation) was used for the affixing process. Following subsequent removal of the first release sheet from the protection membrane-forming film 1, the semiconductor wafer and the protection membrane-forming film were heated at 130° C. for 2 hours in an oven under atmospheric conditions, thereby thermosetting the protection membrane-forming film to form a protection membrane. Using the semiconductor wafer having a protection membrane obtained in this manner, the 60-degree specular glossiness (Gs (60°), units: %) of the protection membrane side surface was measured in accordance with JIS Z 8741:1997 (ISO 2813:1994) using a gloss meter VG 2000 manufactured by Nippon Denshoku Industries Co., Ltd. The results are shown in Table 1.

[Test Example 2]<Measurement of Light Transmittance>

The second release sheet was peeled from the protection membrane-forming sheet obtained in each of the examples and comparative examples, and the resulting structure was heated at 130° C. for 2 hours in an oven under atmospheric conditions, thereby thermosetting the protection membrane-forming film to form a protection membrane. The first release sheet was then removed.

Using a spectrophotometer (UV-VIS-NIR Spectrophotometer UV-3600 manufactured by Shimadzu Corporation), the light transmittance of the protection membrane was measured, and the light transmittance values (%) at wavelengths of 550 nm, 1,064 nm and 1,250 nm were extracted. Measurements were performed using the included large sample chamber MPC-3100, without using an integrating sphere. The results are shown in Table 1.

[Test Example 3]<Print Legibility>

(Step 1)

Each semiconductor wafer having a protection membrane obtained in Test Example 1 was subjected to laser printing under the following conditions, using a green laser marker (MD-S9910A, manufactured by Keyence Corporation).
  Wavelength: 532 nm
  Output: 3.0 W
  Frequency: 60 kHz
  Scan speed: 500 mm/s
  Printed text: ABCD
  Text size: 300 μm (height)×250 μm (width)
  Text spacing: 50 μm
(Step 2)

The printing obtained in Step 1 was observed at a magnification of 100× using a digital microscope (VHS-1000, manufactured by Keyence Corporation), and evaluated against the following 3-grade scale (A to C).
  A: text is readily recognisable, and can be seen clearly
  B: text is readily recognisable
  C: recognition of text is difficult The results are shown in Table 1. Further, the observed images of the printed protection membranes in Examples 1, 3 and 4, and Comparative Example 1 are shown in FIGS. 5 to 8.

TABLE 1

|  | Example 1 | Example 2 | Example 3 | Example 4 | Example 5 | Example 6 | Example 7 |
|---|---|---|---|---|---|---|---|
| A [parts by mass] | 150 | 150 | 150 | 150 | 150 | 150 | 150 |
| B-1 [parts by mass] | 60 | 60 | 60 | 60 | 60 | 60 | 60 |
| B-2 [parts by mass] | 10 | 10 | 10 | 10 | 10 | 10 | 10 |
| B-3 [parts by mass] | 30 | 30 | 30 | 30 | 30 | 30 | 30 |

TABLE 1-continued

| | | | | | | | |
|---|---|---|---|---|---|---|---|
| C-1 [parts by mass] | 2 | 2 | 2 | 2 | 2 | 2 | 2 |
| C-2 [parts by mass] | 0 | 0 | 0 | 0 | 0 | 0 | 0 |
| D [parts by mass] | 2 | 2 | 2 | 2 | 2 | 2 | 2 |
| E-1 [parts by mass] | 320 | 320 | 0 | 0 | 320 | 320 | 320 |
| E-2 [parts by mass] | 0 | 0 | 0 | 0 | 0 | 0 | 0 |
| E-3 [parts by mass] | 0 | 0 | 320 | 0 | 0 | 0 | 0 |
| E-4 [parts by mass] | 0 | 0 | 0 | 320 | 0 | 0 | 0 |
| F [parts by mass] | 2 | 2 | 2 | 2 | 2 | 2 | 2 |
| G-1 [parts by mass] | 5.7 | 0 | 5.7 | 5.7 | 5.7 | 5.7 | 5.7 |
| G-2 [parts by mass] | 2.6 | 0 | 2.6 | 2.6 | 2.6 | 2.6 | 2.6 |
| G-3 [parts by mass] | 6.5 | 0 | 6.5 | 6.5 | 8.5 | 10.5 | 12.5 |
| H [parts by mass] | 0 | 1.2 | 0 | 0 | 0 | 0 | 0 |
| Total [parts by mass] | 590.8 | 577.2 | 590.8 | 590.8 | 592.8 | 594.8 | 596.8 |
| Filler average particle size [μm] | 0.05 | 0.05 | 0.1 | 0.3 | 0.05 | 0.05 | 0.05 |
| Filler amount [% by mass] | 54.2 | 55.4 | 54.2 | 54.2 | 54.0 | 53.8 | 53.6 |
| Carbon black amount [% by mass] | 0 | 0.2 | 0 | 0 | 0 | 0 | 0 |
| Pigment amount [% by mass] | 2.5 | 0 | 2.5 | 2.5 | 2.8 | 3.2 | 3.5 |
| 60-degree specular glossiness Gs (60) [%] | 86 | 82 | 79 | 59 | 84 | 85 | 84 |
| Wavelength 550 nm Transmittance [%] | 19 | 19 | 18 | 7 | 13 | 10 | 7 |
| Wavelength 1,064 nm Transmittance [%] | 76 | 51 | 81 | 65 | 74 | 74 | 71 |
| Wavelength 1,250 nm Transmittance [%] | 80 | 56 | 85 | 72 | 79 | 79 | 77 |
| Print legibility evaluation | A | A | A | B | A | A | A |

| | Example 8 | Example 9 | Comparative Example 1 | Comparative Example 2 | Comparative Example 3 |
|---|---|---|---|---|---|
| A [parts by mass] | 150 | 150 | 150 | 150 | 150 |
| B-1 [parts by mass] | 40 | 0 | 60 | 60 | 60 |
| B-2 [parts by mass] | 30 | 60 | 10 | 10 | 10 |
| B-3 [parts by mass] | 30 | 30 | 30 | 30 | 30 |
| C-1 [parts by mass] | 0 | 0 | 2 | 2 | 2 |
| C-2 [parts by mass] | 2.2 | 1.2 | 0 | 0 | 0 |
| D [parts by mass] | 2.2 | 1.2 | 2 | 2 | 2 |
| E-1 [parts by mass] | 320 | 320 | 0 | 0 | 0 |
| E-2 [parts by mass] | 0 | 0 | 320 | 320 | 320 |
| E-3 [parts by mass] | 0 | 0 | 0 | 0 | 0 |
| E-4 [parts by mass] | 0 | 0 | 0 | 0 | 0 |
| F [parts by mass] | 2 | 2 | 2 | 2 | 2 |
| G-1 [parts by mass] | 5.8 | 5.7 | 5.7 | 0 | 0 |
| G-2 [parts by mass] | 2.6 | 2.6 | 2.6 | 0 | 0 |
| G-3 [parts by mass] | 6.5 | 6.5 | 6.5 | 0 | 0 |
| H [parts by mass] | 0 | 0 | 0 | 1.2 | 0 |
| Total [parts by mass] | 591.3 | 579.2 | 590.8 | 577.2 | 576.0 |
| Filler average particle size [μm] | 0.05 | 0.05 | 0.5 | 0.5 | 0.5 |
| Filler amount [% by mass] | 54.1 | 55.2 | 54.2 | 55.4 | 55.6 |
| Carbon black amount [% by mass] | 0 | 0 | 0 | 0.2 | 0 |
| Pigment amount [% by mass] | 2.5 | 2.6 | 2.5 | 0 | 0 |
| 60-degree specular glossiness Gs (60) [%] | 87 | 75 | 34 | 34 | 34 |
| Wavelength 550 nm Transmittance [%] | 18 | 9 | 6 | 8 | 24 |
| Wavelength 1,064 nm Transmittance [%] | 75 | 63 | 62 | 39 | 71 |
| Wavelength 1,250 nm Transmittance [%] | 79 | 69 | 70 | 45 | 76 |
| Print legibility evaluation | A | A | C | C | C |

As is evident from Table 1, the protection membrane-forming films of the Examples, in which the average particle size of the included filler was not more than 0.4 μm, exhibited excellent print legibility.

INDUSTRIAL APPLICABILITY

The protection membrane-forming film and the protection membrane-forming sheet according to the present invention can be used favorably for producing workpieces having printed protection membranes formed thereon, and processed products (such as chips) of those workpieces, from workpieces such as semiconductor wafers.

DESCRIPTION OF THE REFERENCE SIGNS

1: Protection membrane-forming film
2: Protection membrane-forming sheet
21: Release sheet
3, 3A: Protection membrane-forming sheet
4: Pressure-sensitive adhesive sheet
41: Substrate
42: Pressure-sensitive adhesive layer 5: Jig pressure-sensitive adhesive layer
6: Semiconductor wafer
7: Ring frame

The invention claimed is:

1. A protection membrane-forming film comprising a filler, wherein
an average particle size of the filler is not more than 0.4 µm and
a 60-degree specular glossiness Gs (60°) of a protection membrane formed from the protection membrane-forming film is 40% or higher, and
a light transmittance at a wavelength of 550 nm is not more than 20%.

2. The protection membrane-forming film according to claim 1, having a light transmittance at a wavelength of 1,064 nm of at least 50%.

3. The protection membrane-forming film according to claim 1, having a light transmittance at a wavelength of 1,250 nm of at least 40%.

4. The protection membrane-forming film according to claim 1, wherein the protection membrane-forming film comprises an organic-based colorant.

5. The protection membrane-forming film according to claim 4, wherein the organic-based colorant comprises a pigment.

6. The protection membrane-forming film according to claim 1, wherein the protection membrane-forming film comprises an epoxy resin.

7. The protection membrane-forming film according to claim 6, wherein the epoxy resin comprises at least a liquid epoxy resin that is liquid at 23° C. and 1 atm.

8. The protection membrane-forming film according to claim 7, wherein
the epoxy resin is either composed solely of the liquid epoxy resin, or
the epoxy resin comprises the liquid epoxy resin and a solid epoxy resin that is solid at 23° C. and 1 atm, and an amount of the liquid epoxy resin relative to a total amount of the liquid epoxy resin and the solid epoxy resin is at least 25% by mass but less than 100% by mass.

9. A protection membrane-forming sheet, comprising:
a pressure-sensitive adhesive sheet formed by laminating a pressure-sensitive adhesive layer to one surface of a substrate, and
a protection membrane-forming film laminated to the pressure-sensitive adhesive layer side of the pressure-sensitive adhesive sheet,
wherein the protection membrane-forming film comprises a filler,
wherein an average particle size of the filler is not more than 0.4 µm and
a 60-degree specular glasses Gs (60°) of a protection membrane formed from the protection membrane-forming film is 40% or higher, and
a light transmitter at a wavelength of 550 nm is not more than 20%.

10. A production method for a workpiece or a processed product, the production method comprising:
using a protection membrane-forming film to form a printed protection membrane on a workpiece or a processed product formed by division processing of the workpiece,
wherein the protection membrane-forming film comprises a filler,
wherein an average particle size of the filler is not more than 0.4 µm and
a 60-degree specular glasses Gs (60°) of a protection membrane formed from the protection membrane-forming film is 40% or higher, and
a light transmitter at a wavelength of 550 nm is not more than 20%.

11. The production method for a workpiece or a processed product of claim 10, wherein formation of the printed protection membrane comprises a printing step of irradiating a laser beam onto a surface of the protection membrane-forming film, or onto a surface of a protection membrane formed from the protection membrane-forming film.

12. The production method for a workpiece or a processed product of claim 10, wherein
the division processing is processing in which
an infrared laser beam is irradiated onto focus points set within the workpiece, thereby forming a modified layer inside the workpiece, and
a force is then applied to the workpiece in which the modified layer has been formed, thereby dividing the workpiece in which the modified layer has been formed and obtaining a plurality of pieces as processed products.

13. The production method for a workpiece or a processed product of claim 10, wherein the workpiece is a semiconductor wafer, and the processed product is a semiconductor chip.

14. An inspection method, wherein a workpiece or processed product produced by the production method of claim 10 is inspected through the protection membrane using infrared radiation.

15. A workpiece determined as an adequate product based on the inspection method of claim 14.

16. A processed product determined as an adequate product based on the inspection method of claim 14.

* * * * *